United States Patent
Lin

(10) Patent No.: US 11,728,793 B1
(45) Date of Patent: Aug. 15, 2023

(54) FOUR-PHASE TWENTY-FIVE PERCENT DUTY CYCLE CLOCK GENERATOR

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/821,196

(22) Filed: Aug. 22, 2022

(51) Int. Cl.
*H03K 3/037* (2006.01)
*G06F 1/08* (2006.01)
*H03K 17/687* (2006.01)

(52) U.S. Cl.
CPC ............... *H03K 3/037* (2013.01); *G06F 1/08* (2013.01); *H03K 17/6871* (2013.01)

(58) Field of Classification Search
CPC ....... H03K 3/037; H03K 17/6871; G06F 1/08
See application file for complete search history.

(56) References Cited

U.S. PATENT DOCUMENTS 10,148,257 B1 * 12/2018 Lin .......................... H03K 5/08

* cited by examiner

*Primary Examiner* — Metasebia T Retebo
(74) *Attorney, Agent, or Firm* — McClure, Qualey & Rodack, LLP

(57) ABSTRACT

A four-stage gated ring oscillator having four gated amplifiers configured in a ring topology and comprising a first pair of gated amplifiers, controlled by a first phase of an two-phase input clock, interleaved with a second pair gated amplifiers, controlled by a second phase of the two-phase input clock; and two cross-coupling latches configured to provide cross-coupling between the first pair of gated amplifiers and the second pair of gated amplifiers.

12 Claims, 1 Drawing Sheet

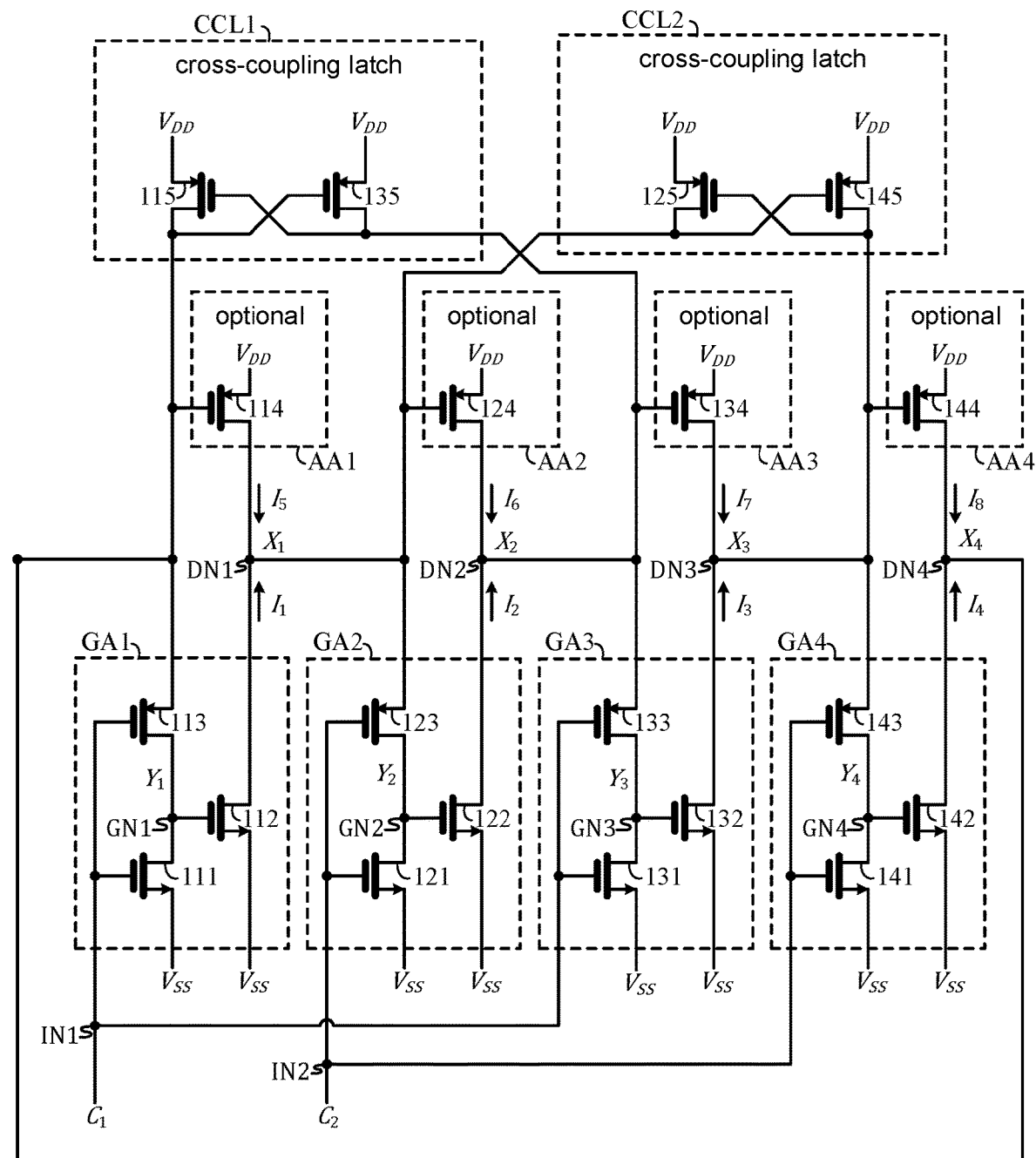

FOUR-PHASE TWENTY-FIVE PERCENT DUTY CYCLE CLOCK GENERATOR

BACKGROUND OF THE DISCLOSURE

Field of the Disclosure

The present disclosure generally relates to generation of four-phase 25% duty cycle clock, and particularly to power efficient generation of four-phase 25% duty cycle clocks.

Description of Related Art

A clock is a logical signal that cyclically toggles back and forth between a low state and a high state; a duty cycle of the clock refers to a percentage of time that the clock stays in the high state. A four-phase clock refers to a collection of four clocks including a first clock, a second clock, a third clock, and a fourth clock that have the same waveform but sequentially and evenly distributed in time; the first clock, the second clock, the third clock, and the fourth clock are referred to as a first phase, a second phase, a third phase, and a fourth phase of the four-phase clock, respectively. Likewise, a two-phase clock refers to a collection of two clocks including a first clock and a second clock that have the same waveform but alternately and evenly distributed in time; the first clock and the second clock are referred to as a first phase and a second phase of the two-phase clock, respectively.

Four-phase clocks are widely used in radio transceivers. In some applications, a four-phase clock of a 25% duty cycle is needed. In U.S. Pat. No. 10,148,257, Lin disclosed a four-phase 25% duty cycle clock generator, which comprises: a divide-by-two circuit configured to receive a two-phase input clock and output four interim clocks that are evenly distributed in time; and a duty converter that utilize a timing relationship between the input clock and the four interim clocks to convert a duty cycle of the four interim clocks to 25%, thus generating a four-phase 25% duty cycle clock. The duty converter is needed because the duty cycle of the four interim clocks is typically 50%. The duty cycle converter, however, consumes power.

What is desired is a power efficient, four-phase 25% duty cycle clock generator.

SUMMARY OF THE DISCLOSURE

A first objective of the present disclosure is to generate a four-phase 25% duty cycle clock in a power efficient manner.

A second objection of the present disclosure is to generate a four-phase 25% duty cycle clock of a high frequency.

Embodiments of the invention include a four-phase 25% duty cycle clock generator utilizing a divide-by-two circuit that can directly output four interim clocks that readily have 25% duty cycle and therefore no duty converter is needed. As a result, the clock generation is more power efficient.

In an embodiment, a clock generator comprises: a first gated amplifier configured to receive a fourth voltage at a fourth drain node and output a first current to a first drain node in accordance with a first phase of an input clock that is a two-phase clock; a second gated amplifier configured to receive a first voltage at the first drain node and output a second current to a second drain node in accordance with a second phase of the input clock; a third gated amplifier configured to receive a second voltage at the second drain node and output a third current to a third drain node in accordance with the first phase of the input clock; a fourth gated amplifier configured to receive a third voltage at the third drain node and output a fourth current to the fourth drain node in accordance with the second phase of the input clock; a first cross-coupling latch configured to provide a regenerative cross-coupling between the fourth drain node and the second drain node; and a second cross-coupling latch configured to provide a regenerative cross-coupling between the first drain node and the third drain node, wherein each of the first gated amplifier, the second gated amplifier, the third gated amplifier, and the fourth gated amplifier comprises a respective sampling switch and a respective reset switch configured to either sample a respective received voltage into a respective gate voltage at a respective gate node or reset the respective gate voltage in accordance with a respective phase of the input clock, and a respective common-source amplifier configured to output a respective current to a respective drain node in accordance with the respective gate voltage.

In an embodiment, a four-stage gated ring oscillator comprises: four gated amplifiers configured in a ring topology and comprising a first pair of gated amplifiers interleaved with a second pair gated amplifiers; and two cross-coupling latches configured to provide cross-coupling between the first pair of gated amplifiers and the second pair of gated amplifiers, wherein during a first phase of a two-phase input clock, an internal gate voltage of the first pair of gated amplifiers is reset, an output current of the first pair of gated amplifiers is shut off, an output voltage of the first pair of gated amplifiers is sampled into an internal gate voltage of the second pair of gated amplifiers and propagates into an output voltage of the second pair of gated amplifiers, while during a second phase of the two-phase input clock, the internal gate voltage of the second pair of gated amplifiers is reset, an output current of the second pair of gated amplifiers is shut off, the output voltage of the second pair of gated amplifiers is sampled into the internal gate voltage of the first pair of gated amplifiers and propagates into the output voltage of the first pair of gated amplifiers.

BRIEF DESCRIPTION OF THE DRAWINGS

FIG. 1 shows a schematic diagram of a clock generator in accordance with an embodiment of the present disclosure.

DETAILED DESCRIPTION OF THIS DISCLOSURE

The present disclosure is directed to clock generation. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "circuit node," "power node," "ground node," "DC (direct current)," "amplifier," "common-source amplifier," "switch," "voltage," "current," "CMOS (complementary metal oxide semiconductor)," "MOST (metal oxide semiconductor transistor)," "PMOST (P-channel metal oxide semiconductor transistor)," "NMOS (N-channel metal oxide semiconductor transistor)," "phase," "frequency," "clock," and "signal." Terms and basic concepts like these are apparent to those of ordinary skill in the art and thus will not be explained in detail here. Those of ordinary skill in the art can also recognize symbols of PMOST and NMOST, and identify the "source," the "gate," and the "drain" terminals thereof.

This disclosure is presented in an engineering sense, instead of a rigorous mathematical sense. For instance, "A is equal to B" means "a difference between A and B is smaller than an engineering tolerance."

A signal is a voltage of a variable level that carries a certain information and can vary with time. A level of the signal at a moment represents a state of the signal at that moment. In this present disclosure, "signal" and "voltage signal" refer to the same thing and thus are interchangeable.

A logical signal is a voltage signal of two states: a low state and a high state; the logical signal is in the high state when its voltage level is above a trip point and in the low state otherwise. The low state is also referred to as a "0" state, while the high stage is also referred to as a "1" state. Regarding a logical signal Q, when we say, "Q is high" or "Q is low," means that "Q is in the high state" or "Q is in the low state." Likewise, "Q is 1" or "Q is 0," means that "Q is in the 1 state" or "Q is in the 0 state."

A first logical signal may not necessarily have the same trip point as a second logical signal.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is a logical inversion of a second logical signal, the first logical signal and the second logical signal are said to be complementary to each other.

A DC (direct current) node is a circuit node of a substantially stationary electrical potential. Throughout this disclosure, "$V_{SS}$" denotes a ground node, while "$V_{DD}$" denotes a power supply node. Both "$V_{SS}$" and "$V_{DD}$" are DC nodes.

A clock is a logical signal that cyclically toggles back and forth between a low state (e.g., of a voltage level of a ground node "$V_{SS}$") and a high state (e.g., a voltage level of a power supply node "$V_{DD}$"). A frequency of a clock is a rate at which the clock performs cycle of back-and-forth toggling.

For a two-phase clock comprising a first clock and a second clock, the two-phase clock is said to be in a first phase when the first clock is high and the second clock is low, and in a second phase when the first clock is low and the second clock is high. The first clock and the second clock are also referred to as the first phase and the second phase, respectively, of the two-phase clock. Therefore, "the first phase of the two-phase clock" can refer to the first clock, but also can refer to a state of the two-phase clock wherein the first clock is high and the second clock is low. The same thing applies to "second phase of the two-phase clock."

A common-source amplifier comprises a MOST (metal oxide semiconductor transistor) configured to receive an input voltage at its gate and output a current through its drain and thus establish an output voltage at its drain, with its source connected to a DC node. A small change of the input voltage can result in a big change of the output voltage, and thus an amplification function can be accomplished.

A first MOST and a second MOST of the same type are said to be cross-coupling when a gate of the first MOST connects to a drain of the second MOST and a drain of the first MOST connects to a gate of the second MOST; a resultant circuit is also known as a "cross-coupling latch" and has a regenerative nature.

A schematic diagram of a clock generator 100 in accordance with an embodiment of the present disclosure is shown in FIG. 1. In FIG. 1: IN1 denotes a first input node, IN2 denotes a second input node, DN1 denotes a first drain node, DN2 denotes a second drain node, DN3 denotes a third drain node, DN4 denotes a fourth drain node, GN1 denotes a first gate node, GN2 denotes a second gate node, GN3 denotes a third gate node, and GN4 denotes a fourth gate node, $C_1$ denotes a first phase of a two-phase input clock provided at IN1, $C_2$ denotes a second phase of the two-phase input clock provided at IN2, $Y_1$ denotes a first gate voltage at GN1, $Y_2$ denotes a second gate voltage at GN2, $Y_3$ denotes a third gate voltage at GN3, $Y_4$ denotes a fourth gate voltage at GN4, $X_1$ denotes a first drain voltage at DN1, $X_2$ denotes a second drain voltage at DN2, $X_3$ denotes a third drain voltage at DN3, and $X_4$ denotes a fourth drain voltage at DN4. Clock generator 100 comprises: a first gated amplifier GA1 configured to receive $X_4$ and output a first current $I_1$ to DN1 in accordance with $C_1$; a second gated amplifier GA2 configured to receive $X_1$ and output a second current $I_2$ to DN2 in accordance with $C_2$; a third gated amplifier GA3 configured to receive $X_2$ and output a third current $I_3$ to DN3 in accordance with $C_1$; a fourth gated amplifier GA4 configured to receive $X_3$ and output a fourth current $I_4$ to DN4 in accordance with $C_2$; a first cross-coupling latch CCL1 configured to provide a regenerative cross-coupling between DN2 and DN4; and a second cross-coupling latch CCL2 configured to provide a regenerative cross-coupling between DN1 and DN3. In an optional embodiment, clock generator 100 further comprises: a first auxiliary amplifier AA1 configured to receive $X_4$ and output a fifth current $I_5$ to DN1; a second auxiliary amplifier AA2 configured to receive $X_1$ and output a sixth current $I_6$ to DN2; a third auxiliary amplifier AA3 configured to receive $X_2$ and output a seventh current $I_7$ to DN3; and a fourth auxiliary amplifier AA4 configured to receive $X_3$ and output an eighth current $I_8$ to DN4.

Gated amplifier GA1 (GA2, GA3, GA4) comprises NMOST (n-channel metal oxide semiconductor transistor) 111 (121, 131, 141), NMOST 112 (122, 132, 142), and PMOST (p-channel metal oxide semiconductor transistor) 113 (123, 133, 143). A source, a gate, and a drain of NMOST 111 (121, 131, 141) connect to $V_{SS}$, IN1 (IN2, IN1, IN2), and GN1 (GN2, GN3, GN4), respectively. A source, a gate, and a drain of NMOST 112 (122, 132, 142) connect to $V_{SS}$, GN1 (GN2, GN3, GN4), and DN1 (DN2, DN3, DN4), respectively. A source, a gate, and a drain of PMOST 113 (123, 133, 143) connect to DN4 (DN1, DN2, DN3), IN1 (IN2, IN1, IN2), and GN1 (GN2, GN3, GN4), respectively. CCL1 comprises PMOST 115 and PMOST 135, while CCL2 comprises PMOST 125 and PMOST 145. A source, a gate, and a drain of PMOST 115 (125, 135, 145) connect to $V_{DD}$, DN2 (DN3, DN4, DN1), and DN4 (DN1, DN2, DN3), respectively. AA1 (AA2, AA3, AA4) comprises PMOST 114 (124, 134, 144). A source, a gate, a drain of PMOST 114 (124, 134, 144) connect to $V_{DD}$, DN4 (DN1, DN2, DN3), and DN1 (DN2, DN3, and DN4), respectively.

GA1, GA2, GA3, and GA4 form a four-stage gated ring oscillator. GA1 receives $X_4$ and outputs $X_1$, GA2 receives $X_1$ and outputs $X_2$, GA3 receives $X_2$ and outputs $X_3$, and GA4 receives $X_3$ and outputs $X_4$, thus completing a cycle of signal propagation. This way, $X_1$, $X_2$, $X_3$, and $X_4$ are evenly distributed in time to form a four-phase signal. However, the four-stage gated ring oscillator is not free running but controlled by the two-phase input clock that comprises the first phase $C_1$ and the second phase $C_2$. During a first phase of the input clock where $C_1$ is high and $C_2$ is low, $Y_1$ and $Y_3$ are reset due to being pulled down to $V_{SS}$ by NMOST 111 and NMOST 131, respectively, thus shutting off NMOST 112 and NMOST 132 and halting the signal propagation from $X_4$ and $X_2$ to $X_1$ and $X_3$, respectively. In the meanwhile, PMOST 123 and PMOST 143 are turned on to sample $X_1$ and $X_3$ into $Y_2$ and $Y_4$, respectively, and NMOST 122 and NMOST 142 embody two common-source amplifiers that amplify $Y_2$ and $Y_4$ into $X_2$ and $X_4$, respectively, enabling $X_1$ and $X_3$ to propagate into $X_2$ and $X_4$, respectively. During a second phase of the input clock where $C_1$ is low and $C_2$ is high, $Y_2$ and $Y_4$ are reset due to being pulled down to $V_{SS}$ by NMOST 121 and NMOST 141, respectively, thus shutting off NMOST 122 and NMOST 142 and halting the signal propagation from $X_1$ and $X_3$ to $X_2$ and $X_4$, respectively. In the meanwhile, PMOST 113 and PMOST 133 are turned on to sample $X_4$ and $X_2$ into $Y_1$ and $Y_3$, respectively, and NMOST 112 and NMOST 132 embody two common-source amplifiers that amplify $Y_1$ and $Y_3$ into $X_1$ and $X_3$, respectively, enabling $X_4$ and $X_2$ to propagate into $X_1$ and $X_3$, respectively. Therefore, it takes two clock cycles of $C_1$ and $C_2$ for the four-phase gated ring oscillator to complete one cycle of signal propagation. A frequency of the four-phase signal is thus half of a frequency of $C_1$ and $C_2$. Therefore, clock generator 100 is effectively a divide-by-two circuit, wherein an output clock frequency is half of an input clock frequency.

CCL1 provides cross-coupling between DN4 and DN2 so that $X_4$ and $X_2$ are complementary and have approximately 50% duty cycle. Likewise, CCL2 provides cross-coupling between DN1 and DN3 so that $X_1$ and $X_3$ are complementary and have approximately 50% duty cycle.

Any circuit that can output a logical signal with a two-way transition, low to high and high to low, needs at least two transistors stacked up between a power supply node and a ground node; the less number of transistors stacked up, the higher attainable speed of transition due to a potentially lower resistance and larger swing. For each of $X_1$, $X_2$, $X_3$, and $X_4$, a pull-up to "Vbb" is carried out through one PMOST and a pull-down to "$V_{SS}$" is carried out through one NMOST; in other words, there are only two transistors, one PMOST and one NMOST, stacked up between the power supply node "$V_{DD}$" and the ground node "$V_{SS}$" to perform a two-way state transition. Therefore, clock generator 100 can have a high speed, allowing the four-phase signal comprising $X_1$, $X_2$, $X_3$, and $X_4$ to have a high frequency. On the other hand, for each of $Y_1$, $Y_2$, $Y_3$, and $Y_4$, a pull-down to "$V_{SS}$" is carried out through one NMOST but a pull-up to "$V_{DD}$" is carried out through two PMOSTs in series. However, unlike $X_1$, $X_2$, $X_3$, and $X_4$ that are output voltages of common-source amplifiers that demand a large swing, $Y_1$, $Y_2$, $Y_3$, and $Y_4$ are input voltages of common-source amplifiers that have an inherently amplification function and do not demand a large swing, thus the pull-up through two PMOSTs is not a big issue.

AA1 (AA2, AA3, AA4) can be used to further speed up the signal propagation from $X_4$ ($X_1$, $X_2$, $X_3$) to $X_1$ ($X_2$, $X_3$, $X_4$), and thus increasing a workable frequency.

During the first phase of the input clock where $C_1$ is high and $C_2$ is low, $Y_1$ ($Y_3$) is reset, i.e., pulled low to "$V_{SS}$"; during the second phase of the input clock where $C_1$ is low and $C_2$ is high, $Y_1$ ($Y_3$) can be pulled high only when $X_4$ ($X_2$) is high. In practice, $X_4$ ($X_2$) is high only for 50% of the time, and therefore, $Y_1$ ($Y_3$) can be pulled high for approximately 50% of the time in the second phase of the input clock. As a result, $Y_1$ ($Y_3$) can be pulled high for only approximately 25% of the time, and therefore, a duty cycle of $Y_1$ ($Y_3$) is approximately 25%. The same thing can be said about $Y_2$ ($Y_4$), only that the pull-high occurs in the first phase of the input clock where $C_1$ is high and $C_2$ is low. Therefore, $Y_1$, $Y_2$, $Y_3$, and $Y_4$ can form a four-phase clock of approximately 25% duty cycle. If an output clock of 50% duty cycle is needed, the output clock can be taken from $X_1$, $X_2$, $X_3$, and $X_4$. If an output clock of 25% duty cycle is needed, the output clock can be taken from $Y_1$, $Y_2$, $Y_3$, and $Y_4$. Since the clock generator 100 can directly generate a four-phase 25% duty cycle clock without a need to use a duty converter, clock generator 100 can be more power efficient than the prior art clock generator disclosed in U.S. Pat. No. 10,148,257.

For a given circuit comprising a plurality of NMOSTs and a plurality of PMOSTs and working across a power supply node "$V_{DD}$" and a ground node "$V_{DD}$," a complementary circuit can be constructed by replacing every NMOST with a PMOST, replacing every PMOST with a NMOST, and swapping the power supply node "$V_{DD}$" with the ground node "$V_{SS}$." The complementary circuit will have the same function as the originally given circuit. Therefore, in the appended claims, NMOST and PMOST are not explicitly specified; instead, "MOST of a first type" and "MOST of a second type" are used. Likewise, "ground node" is not explicitly referred; instead, "DC node" is used. In one embodiment, "DC node" refers to a ground node and "MOST of a first type" and "MOST of a second type" refer to NMOST and PMOST, respectively. In another embodiment, "DC node" refers to a power supply node and "MOST of a first type" and "MOST of a second type" refer to PMOST and NMOST, respectively.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A clock generator comprising:
   a first gated amplifier configured to receive a fourth voltage at a fourth drain node and output a first current to a first drain node in accordance with a first phase of an input clock that is a two-phase clock;
   a second gated amplifier configured to receive a first voltage at the first drain node and output a second current to a second drain node in accordance with a second phase of the input clock;
   a third gated amplifier configured to receive a second voltage at the second drain node and output a third current to a third drain node in accordance with the first phase of the input clock;
   a fourth gated amplifier configured to receive a third voltage at the third drain node and output a fourth current to the fourth drain node in accordance with the second phase of the input clock;
   a first cross-coupling latch configured to provide a regenerative cross-coupling between the fourth drain node and the second drain node; and
   a second cross-coupling latch configured to provide a regenerative cross-coupling between the first drain node and the third drain node, wherein each of the first gated amplifier, the second gated amplifier, the third gated amplifier, and the fourth gated amplifier comprises a respective sampling switch and a respective reset switch configured to either sample a respective received voltage into a respective gate voltage at a respective gate node or reset the respective gate voltage in accordance with a respective phase of the input clock, and a respective common-source amplifier configured to output a respective current to a respective drain node in accordance with the respective gate voltage.

2. The clock generator of claim 1, wherein said respective common-source amplifier comprises a MOST (metal oxide semiconductor transistor) of a first type with a source, a gate, and a drain, connected to a DC (direct current) node, said respective gate node, and said respective drain node, respectively.

3. The clock generator of claim 2, wherein said respective sampling switch comprises a MOST (metal oxide semiconductor transistor) of a second type with a gate controlled by said respective phase of the input clock.

4. The clock generator of claim 3, wherein said respective reset switch comprises a MOST of the first type with a gate controlled by said respective phase of the input clock and configured to pull said respective gate voltage to a DC voltage corresponding to a reset state.

5. The clock generator of claim 2, wherein each of the first cross-coupling latch and the second cross-coupling latch comprises two MOSTs of a second type configured in a cross-coupling topology.

6. The clock generator of claim 1 further comprising a first auxiliary amplifier configured to receive the fourth voltage and output a fifth current to the first drain node, a second auxiliary amplifier configured to receive the first voltage and output a sixth current to the second drain node, a third auxiliary amplifier configured to receive the second voltage and output a seventh current to the third drain node, and a fourth auxiliary amplifier configured to receive the third voltage and output an eighth current to the fourth drain node.

7. The clock generator of claim 1 further comprising a first auxiliary amplifier configured to receive the fourth voltage and output a fifth current to the first drain node, a second auxiliary amplifier configured to receive the first voltage and output a sixth current to the second drain node, a third auxiliary amplifier configured to receive the second voltage and output a seventh current to the third drain node, and a fourth auxiliary amplifier configured to receive the third voltage and output an eighth current to the fourth drain node, wherein each of the first auxiliary amplifier, the second auxiliary amplifier, the third auxiliary amplifier, and the fourth auxiliary amplifier comprises a MOST of a type that is different from a type of a MOST that embodies said respective common-source amplifier.

8. A four-stage gated ring oscillator comprising:
four gated amplifiers configured in a ring topology and comprising a first pair of gated amplifiers interleaved with a second pair gated amplifiers; and
two cross-coupling latches configured to provide cross-coupling between the first pair of gated amplifiers and the second pair of gated amplifiers, wherein
during a first phase of an input clock that is a two-phase clock, an internal gate voltage of the first pair of gated amplifiers is reset, an output current of the first pair of gated amplifiers is shut off, an output voltage of the first pair of gated amplifiers is sampled into an internal gate voltage of the second pair of gated amplifiers and propagates into an output voltage of the second pair of gated amplifiers, while
during a second phase of the input clock, the internal gate voltage of the second pair of gated amplifiers is reset, an output current of the second pair of gated amplifiers is shut off, the output voltage of the second pair of gated amplifiers is sampled into the internal gate voltage of the first pair of gated amplifiers and propagates into the output voltage of the first pair of gated amplifiers.

9. The four-stage gated ring oscillator of claim 8, wherein each of the four gated amplifiers comprises a sampling switch and a reset switch configured to provide sampling and reset, respectively, for an internal gate voltage, in accordance with a respective phase of the input clock, and a common-source amplifier configured to receive the internal gate voltage and output an output current.

10. The four-stage gated ring oscillator of claim 9, wherein each of the common-source amplifier and the reset switch comprises a MOST (metal oxide semiconductor transistor) of a first type, while the sampling switch comprises a MOST of a second type.

11. The four-stage gated ring oscillator of claim 10, wherein each of two cross-coupling latches comprises two MOSTs of the second type configured in a cross-coupling topology.

12. The four-stage gated ring oscillator of claim 8 further comprises four auxiliary amplifiers configured in a ring topology and are connected in parallel with the four gated amplifiers.

* * * * *